United States Patent [19]
Iida et al.

[11] Patent Number: 5,406,225
[45] Date of Patent: Apr. 11, 1995

[54] BIAS CONTROL CIRCUIT FOR RADIO-FREQUENCY POWER AMPLIFIER

[75] Inventors: Sachio Iida, Chiba; Norio Shimo, Kanagawa; Hideaki Sato, Saitama, all of Japan

[73] Assignee: Sony Corporation, Tokyo, Japan

[21] Appl. No.: 158,766

[22] Filed: Nov. 30, 1993

[30] Foreign Application Priority Data

Dec. 9, 1992 [JP] Japan .................. 4-352065

[51] Int. Cl.$^6$ ............................. H03G 3/30
[52] U.S. Cl. .................. 330/279; 330/130; 330/296; 455/127
[58] Field of Search ............... 330/129, 130, 279, 296; 455/127

[56] References Cited

U.S. PATENT DOCUMENTS

| | | | |
|---|---|---|---|
| 5,128,629 | 7/1992 | Trinh | 330/129 |
| 5,196,806 | 3/1993 | Ichihara | 330/279 X |
| 5,304,947 | 4/1994 | Carlsson | 330/279 |

FOREIGN PATENT DOCUMENTS

| | | | |
|---|---|---|---|
| 0369135A3 | 5/1990 | European Pat. Off. | H03G 3/20 |
| 0401013A3 | 12/1990 | European Pat. Off. | H03F 1/02 |
| 0481741A2 | 4/1992 | European Pat. Off. | H03F 3/193 |
| 0482502A3 | 4/1992 | European Pat. Off. | H03F 1/02 |
| 0156694A1 | 10/1985 | France | H03F 1/02 |

*Primary Examiner*—James B. Mullins
*Attorney, Agent, or Firm*—Limbach & Limbach; Philip M. Shaw, Jr.

[57] ABSTRACT

A bias control circuit for a radio-frequency power amplifier which performs linear power amplification of an intermittent radio-frequency signal. The control circuit includes a bias voltage setting circuit for supplying a bias voltage of a predetermined value to a power amplifying element during a time period in which substantially none of the radio-frequency signal is supplied to the power amplifying element, and for setting the idle current of the power amplifying element to a predetermined value. The control circuit further includes a sample and hold circuit for sampling and holding the bias voltage during the time period in which substantially none of the radio-frequency signal is supplied to the power amplifying element. The output voltage of the sample and hold circuit is supplied as a bias voltage to the power amplifying element during the subsequent time period of supply of the radio-frequency signal to the power amplifying element, whereby the idle current of the power amplifying element is stabilized despite any temperature fluctuation.

5 Claims, 5 Drawing Sheets

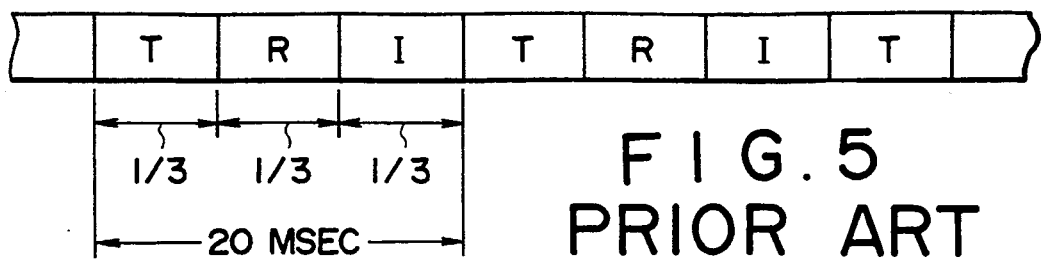
FIG. 5
PRIOR ART
FIG. 6
PRIOR ART
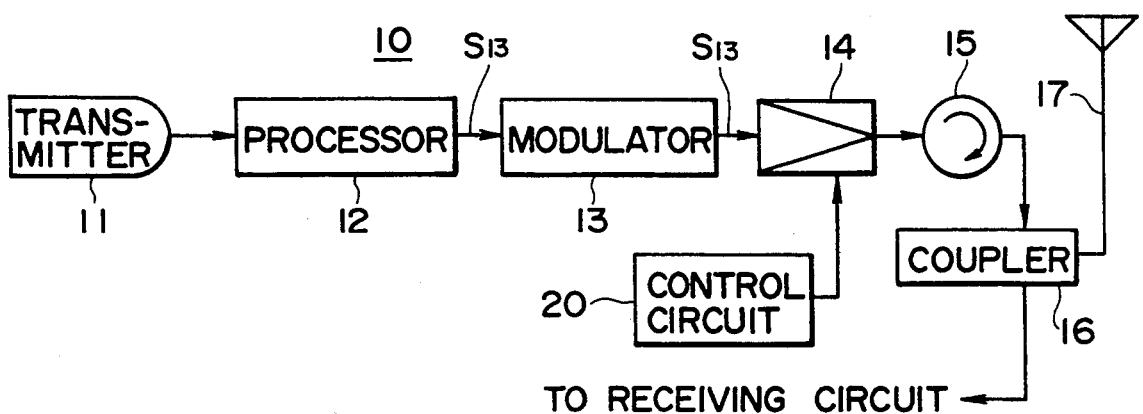
TO RECEIVING CIRCUIT
FIG. 7
PRIOR ART
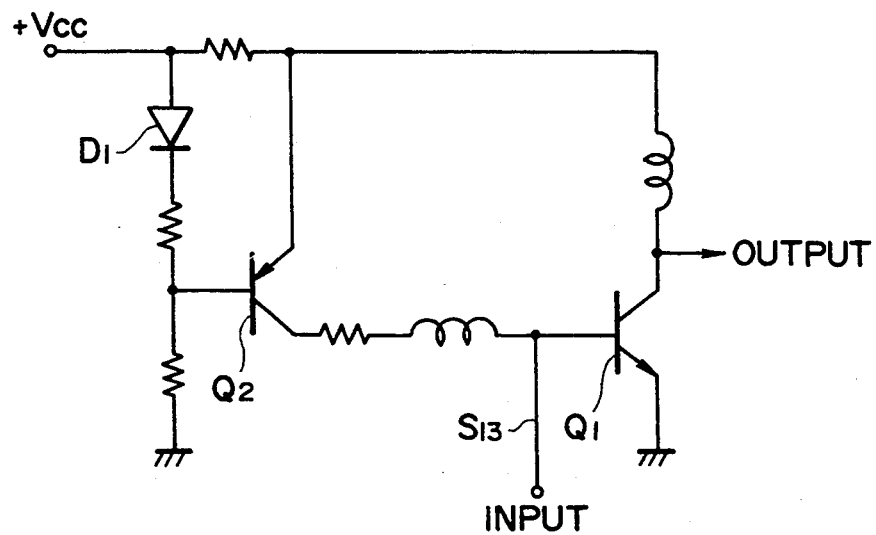

BIAS CONTROL CIRCUIT FOR RADIO-FREQUENCY POWER AMPLIFIER

BACKGROUND OF THE INVENTION

1. Field of the Invention

The present invention relates to a bias control circuit for a radio-frequency power amplifier for use in a digital portable telephone system.

2. Description of the Related Art

In a digital cellular telephone system such as portable telephone or automobile telephone, a TDMA method is generally employed to perform alternate transmission and reception by using the same frequency. According to this method, as shown in FIG. 5 for example, a transmission time slot T, a reception time slot R and an idle time slot I are repeated temporally and sequentially in one channel of a fixed frequency.

If 1 block consisting of such successive transmission time slot T, reception time slot R and idle time slot I has a time length of, e.g., 20 msec, it follows that each of the transmission time slot T, reception time slot R and idle time slot I has an equal duration of 20/3 msec.

Transmission from a mobile station to a base station is performed during the transmission time slot T, and reception from the base station is performed during the reception time slot R. The idle time slot I is used for measuring the electric field intensity.

FIG. 6 shows an example of a transmitting circuit in a conventional mobile station. In the transmitting circuit denoted by reference numeral 10, a sound signal is supplied from a transmitter 11 to a digital processor 12 to be thereby converted into a digital signal which is intermittent every transmission time slot T in conformity to a predetermined format, and the digital signal thus obtained is supplied to a modulator 13 to be converted into a transmission signal S13 through orthogonal modulation. Then the transmission signal S13 is supplied to a transmitting/receiving antenna 17 via a signal line consisting of a radio-frequency power amplifier 14, an isolator 15 and a common antenna coupler 16, so that the signal S13 is transmitted to the base station. The frequency band used for such transmission ranges, e.g., from 940 to 960 MHz.

Since the transmission signal S13 is processed through orthogonal modulation and has an amplitude component, it is necessary for the amplifier 14 to execute power amplification of the signal S13 linearly. For this reason, the amplifier 14 needs to perform its operation in the class A or AB.

However, a power transistor constituting the final stage of the power amplifier 14 deals with a considerably great power, so that the temperature in the transistor fluctuates a lot due to the heat generated therefrom. In general, the operating point of the transistor varies depending on the temperature.

A bias control circuit 20 is incorporated in the transmitting circuit of FIG. 6 so that the idle current of the power transistor in the amplifier 14 is controlled to remain at a predetermined value, thereby enabling the amplifier 14 to operate in the class A or AB regardless of the temperature fluctuation.

Circuits shown in FIGS. 7 to 9 may be contrived to serve as the power amplifier 14 and the control circuit 20 which satisfy the conditions mentioned. For the purpose of simplifying the explanation, there drawings merely represent the theoretical connection or constitution.

In the circuit of FIG. 7, there are shown a power transistor Q1 in the final stage, a transistor Q2 for applying a base bias to the transistor Q1, and a temperature compensating diode D1. A voltage including the terminal voltage of the diode D1 is supplied to the transistor Q2 as a base-emitter voltage thereof, so that the collector current of the transistor Q2 is stably maintained at a predetermined value regardless of any temperature fluctuation. Since such collector current is the base current of the transistor Q1, the idle current (collector current) of the transistor Q1 is also stabilized despite the temperature fluctuation.

In the circuit of FIG. 8, a power amplifying transistor Q3 is provided in the final stage. And the voltage obtained from a diode D3 is supplied as a base bias voltage to the transistor Q3. Therefore the idle current of the transistor Q3 is stably maintained at a predetermined value despite any temperature fluctuation.

And in the circuit of FIG. 9, there are included a power amplifying MOS FET Q4 in the final stage, and a thermistor R4. The terminal voltage of the thermistor R4 is supplied to the MOS FET Q4 as a gate bias voltage thereof. Consequently the idle current of the FET Q4 is stably maintained at a predetermined value regardless of any temperature fluctuation.

The circuit of FIG. 7 is effective when the transistor Q1 operates in the class A, but it is impossible to operate the transistor Q1 in the class AB since the collector current thereof is changed in accordance with the level of the transmission signal S13.

Also in the circuit of FIG. 7, the temperature compensating diode D1 needs to be thermally coupled to the transistor Q2. In the circuits of FIGS. 8 and 9, the temperature compensating diode D3 or the thermistor R4 also needs to be thermally coupled to the transistor Q3 or the FET Q4. However, the transistor Q2 to be thermally coupled in the circuit of FIG. 7 is used merely for control, whereas the transistor Q3 (in FIG. 8) the FET Q4 (in FIG. 9) to be thermally coupled is used for power amplification of the transmission signal S13. Therefore, in the circuits of FIGS. 8 and 9, the mounting or arrangement of the circuits and the component elements thereof need to be particularly designed for averting interference and leakage of the signal S13.

In addition to the above, it is necessary in the circuit of FIG. 9 to adjust the temperature characteristic of the thermistor R4 in conformity with that of the FET Q4, hence raising another problem which can complicate the process of manufacture.

SUMMARY OF THE INVENTION

It is therefore an object of the present invention to provide an improved bias control circuit for a radio-frequency power amplifier with an advantage of enhancing the productivity, wherein the problems mentioned above can be eliminated to ensure a satisfactory performance such that the idle current is retained stably at a set value despite the occurrence of any sharp temperature fluctuation in a wide range.

According to one aspect of the present invention, there is provided a bias control circuit for a radio-frequency power amplifier which performs linear power amplification of a radio-frequency signal supplied thereto intermittently at a predetermined repetition cycle. The bias control circuit comprises a bias voltage setting circuit for supplying a bias voltage of a predetermined value to a power amplifying element during a time period in which substantially none of the radio-frequency signal is supposed to be supplied to the power amplifying element. The bias voltage setting circuit also sets the idle current of the power amplifying element to a predetermined value. The bias control circuit also includes a sample and hold circuit for sampling and holding the bias voltage during the time period in which substantially none of the radio-frequency signal is supposed to be supplied to the power amplifying element. During the following time period in which the radio-frequency signal is supplied to the power amplifying element, the output voltage of the sample and hold circuit is supplied as a bias voltage to the power amplifying element instead of the output of the bias voltage setting circuit.

In such a bias control circuit, the bias voltage setting circuit comprises a temperature compensating diode. The bias voltage setting circuit further includes a transistor supplied with the bias voltage including the terminal voltage of the diode, and a circuit for feeding back the output current in the power amplifying element to the transistor. The output voltage of the transistor is supplied to the sample and hold circuit.

The sample and hold circuit comprises an A-D converter for executing analog-to-digital conversion of the input voltage, a memory for holding the output data of the A-D converter, and a D-A converter for executing digital-to-analog conversion of the data held in the memory.

During the time period in which the radio-frequency signal is supplied, the voltage from a power source is supplied to the power amplifying element regardless of the feedback circuit.

The above and other features and advantages of the present invention will become apparent from the following description which will be given with reference to the illustrative accompanying drawings.

BRIEF DESCRIPTION OF THE DRAWINGS

FIG. 5 is a schematic diagram for explaining a TDMA system;

FIG. 6 is a block diagram of an exemplary transmitting circuit;

FIG. 7 is a circuit diagram of a conventional example in the related art;

DESCRIPTION OF THE PREFERRED EMBODIMENTS

Hereinafter preferred embodiments of the present invention will be described in detail with reference to the accompanying drawings.

Figure 1:
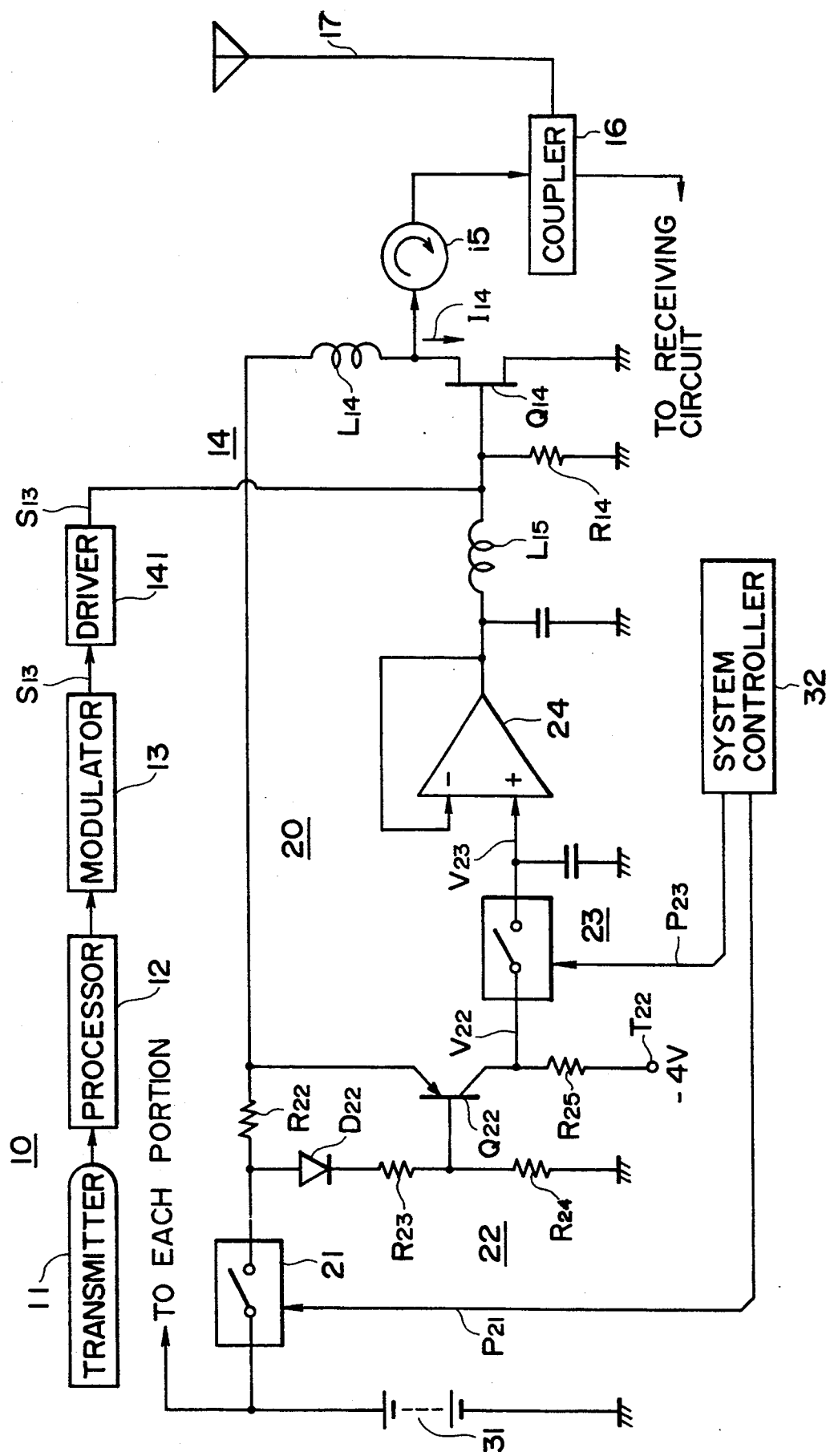
FIG. 1 is a circuit diagram showing a preferred embodiment of the present invention.

FIG. 1 is a circuit diagram representing an exemplary embodiment of the invention. In this diagram, the final stage of a power amplifier 14 consists of a grounded-source field effect transistor (FET) Q14. The gate of the FET Q14 is grounded via a resistor R14, and the drain thereof is connected to a coil L14. A transmission signal S13 obtained from a modulator 13 is supplied via a drive stage 141 of the power amplifier 14 to the gate of the FET Q14, and its drain output is supplied to an isolator 15.

A battery 31 for supplying a voltage of, e.g., 4 V is used as a power source for the entire circuit, and a system controller 32 consists of a microcomputer or the like.

A bias control circuit 20 comprises a bias voltage setting circuit 22 and a sample and hold circuit 23, and has the following configuration. The battery 31 is connected via a switch circuit 21 and a resistor R22 to the coil L14. A temperature compensating diode D22 and resistors R23, R24 are connected in series between the output of the switch circuit 21 and the ground, and the junction of the resistors R23 and R24 is connected to the base of a transistor Q22, whose emitter is connected to the junction of the resistor R22 and the coil L14. The collector of the transistor Q22 is connected via a resistor R25 to a voltage terminal T22 which is reverse in polarity to the battery 31. The bias setting circuit 22 is so constituted as mentioned.

The sample and hold circuit 23 is connected to the collector of the transistor Q22, and the output voltage V23 of the circuit 23 is supplied as a bias voltage to the gate of the FET Q14 via a buffer voltage follower 24 and a coil L15.

Figure 2:
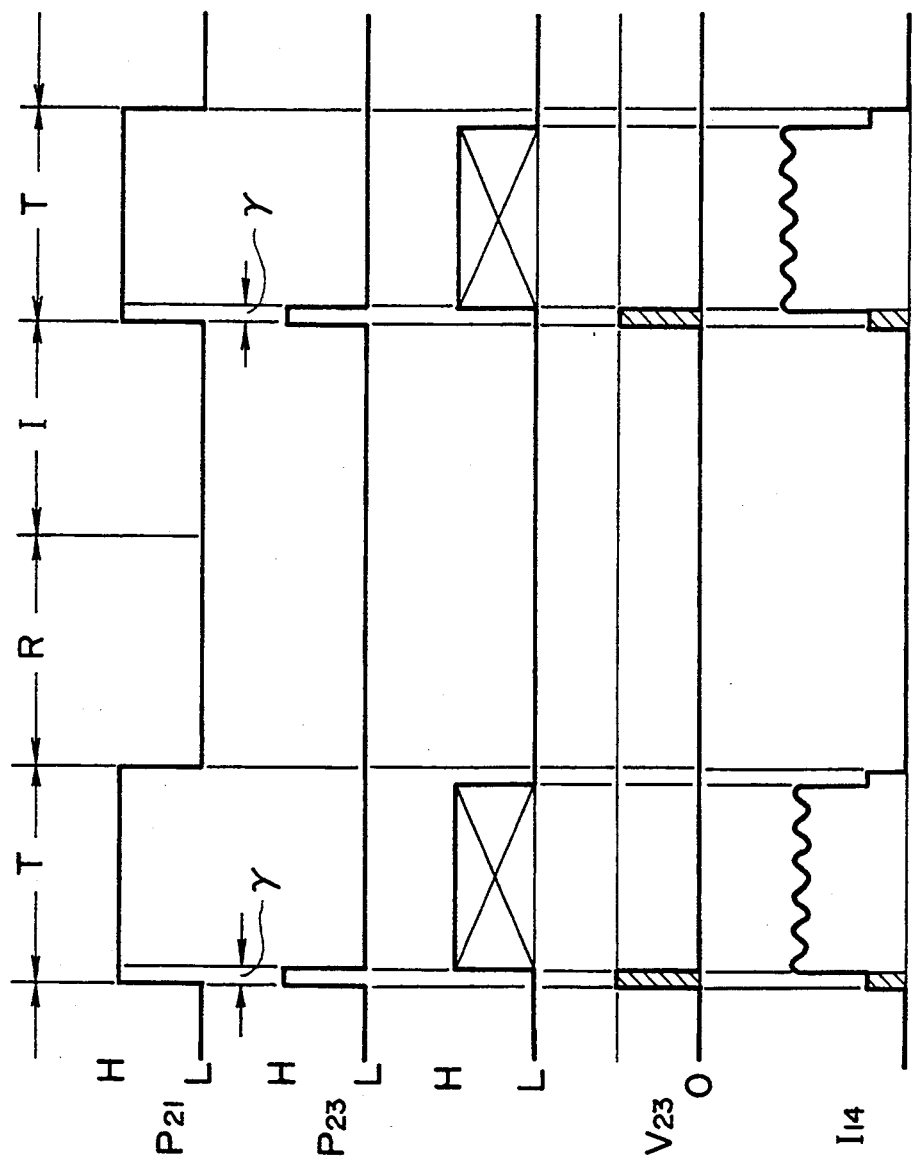
FIGS. 2A-2E are a waveform chart of signals for explaining the operation of the embodiment shown in FIG. 1.

Further, as shown in FIG. 2A for example, a pulse P21 turned to a high level ("H") during a transmission time slot T is obtained from the system controller 32 and, as shown in FIG. 2B, a pulse P23 turned to a high level during a predetermined short time period $\tau$ at the start point of the transmission time slot T is also obtained from the system controller 32. The pulse P21 is supplied as a control signal to the switch circuit 21, which is thereby turned on during the high-level period of the pulse P21. Meanwhile the pulse P23 of the input voltage is supplied as a control signal to the sample and hold circuit 23, which then samples the input voltage during the high-level period of the pulse P23 and holds the sampled voltage during the low-level ("L") period of the pulse P23.

Further in this embodiment, as shown in FIG. 2C, the digital signal outputted from the processor 12 is delivered during the time period excluding at least the start time period $\tau$ from the transmission time slot T.

In the constitution mentioned above, upon arrival of the transmission time slot T, the switch circuit 21 is turned on by the pulse P21 so that the operating voltages are applied respectively to the transistor Q22 and the FET Q14. Then the transistor Q22 is base-biased by the voltage including the terminal voltage of the diode D22, so that a constant collector current flows in the collector of the transistor Q22 regardless of any temperature fluctuation, whereby the collector is maintained stably at the constant collector voltage V22 despite occurrence of any temperature fluctuation.

During the time period $\tau$, the collector voltage V22 is supplied as a gate bias voltage to the FET Q14 via a line consisting of the sample and hold circuit 23, the voltage follower 24 and the coil L15, so that a drain current I14 comes to flow in the FET Q14 corresponding to the bias voltage.

When the drain current I14 in the FET Q14 increases for example, it causes an increase of the voltage drop across the resistor R22 to lower the base bias voltage of the transistor Q22 as a result, whereby the collector current thereof is decreased to consequently lower the collector voltage V22. Since this signifies a drop of the gate bias voltage of the FET Q14, the drain current I14 thereof is decreased. More specifically, feedback is effected to the FET Q14 via the resistor R22, so that the drain current I14 thereof is stabilized against any temperature fluctuation.

After the lapse of the time period $\tau$, the voltage V22 during such period $\tau$, is supplied from the sample and hold circuit 23 via the voltage follower 24 and the coil L15 to the gate of the FET Q14 as its bias voltage, so that such bias voltage causes a flow of the drain current I14 in the FET Q14.

More specifically, in the sample and hold circuit 23, the collector voltage V22 is sampled during the time period $\tau$ and then is held until the next time periods. Therefore, as shown in FIG. 2D, a DC voltage V23 equivalent to the collector voltage V22 during the time period $\tau$ is outputted from the sample and hold circuit 23, and such voltage V23 is supplied as a bias voltage to the gate of the FET Q14 via the voltage follower 24. Consequently the drain current I14 of the FET Q14 is stably maintained at the predetermined value during the time periods, and the gate bias voltage V23 for causing a flow of such drain current I14 during the period $\tau$, is supplied continuously to the FET Q14 even after the period $\tau$, whereby the drain current I14 is stabilized against any temperature fluctuation even after the lapse of such period $\tau$.

During the time period $\tau$, the FET Q14 is enabled by the bias voltage V23 to operate in the class A, and therefore it is rendered possible to cause a flow of the drain current I14 corresponding to the bias voltage V23, i.e., an idle current as shown in FIG. 2E. Subsequently after the lapse of the period $\tau$, the transmission signal S13 is supplied to the FET Q14, so that the drain current I14 of the FET Q14 exceeds the idle current as shown in FIG. 2E and becomes proportional to the level of the transmission signal S13. It signifies that the FET Q14 operates in the class AB to consequently enhance the power efficiency.

According to the bias control circuit 20 mentioned above, the idle current of the power amplifying FET Q14 is set to the predetermined value by controlling the gate bias voltage V23 applied to the FET Q14 during the time period $\tau$ in which substantially none of the transmission signal S13 is supposed to be supplied to the FET Q14, and the gate bias voltage V23 obtained during such time period is sampled and held. Then the sampled voltage thus held is supplied as the gate bias voltage V23 to the FET Q14 during the subsequent period in which the transmission signal S13 is supplied thereto, whereby the idle current of the FET Q14 can be maintained at the set value despite occurrence of any temperature fluctuation in a wide range.

Since the idle current of the FET Q14 can thus be maintained at the set value regardless of any temperature fluctuation, it becomes possible to retain the efficiency of the power amplifier 14 constant. In addition, due to the effect of updating the temperature compensation per period $\tau$, i.e., for every transmission of the intermittent signal S13, the idle current of the FET Q14 can be kept continuously at the set value. Furthermore, as the idle current of the FET Q14 is not adversely effected by any temperature fluctuation, the transmitting circuit 10 may be installed in an automobile trunk or the like where sharp temperature fluctuation is prone to occur. Besides the above, there exists no need to adjust the guaranty amount of temperature compensation with regard to the FET Q14, hence ensuring remarkable enhancement of the productivity.

Figure 3:
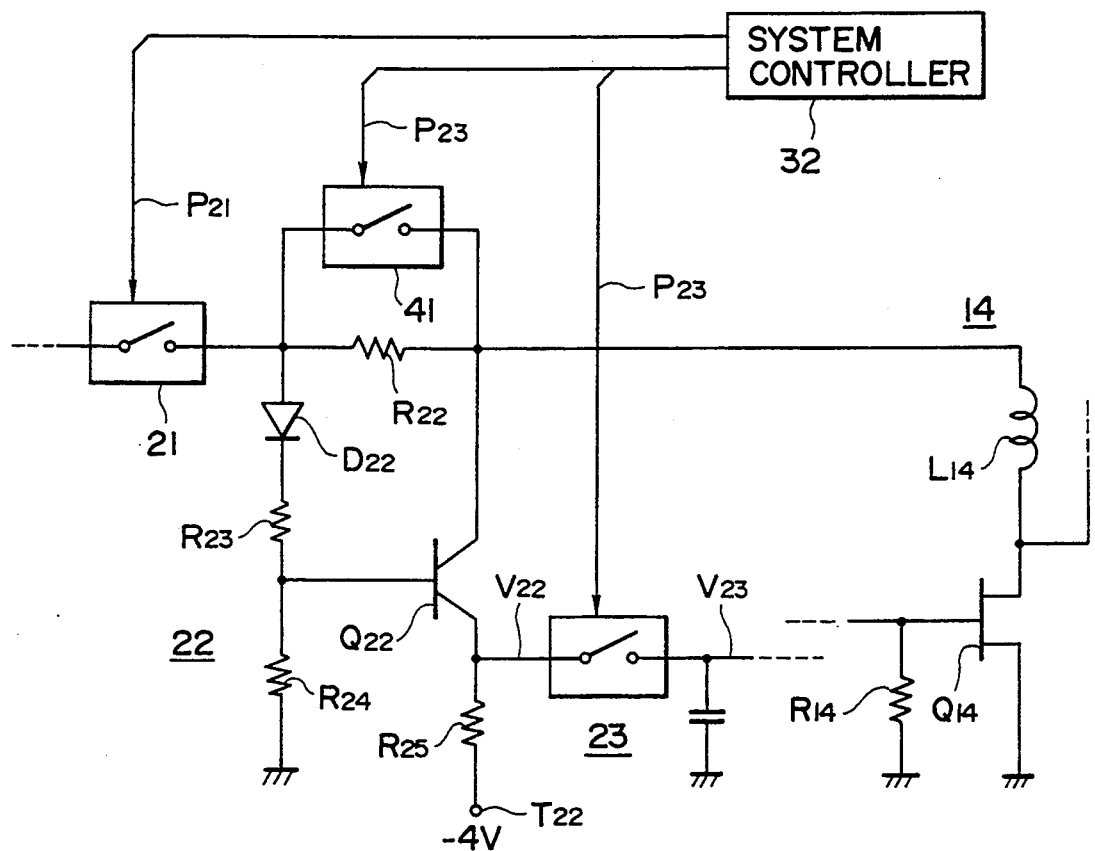
FIG. 3 is a circuit diagram partially showing another embodiment of the invention.

FIG. 3 shows another embodiment of the present invention, where the equivalent or same component circuits and elements as those employed in the aforementioned embodiment of FIG. 1 are denoted by the same reference numerals, and a detailed description thereof is omitted. In the embodiment of FIG. 3, a switch circuit 41 is connected in parallel to the feedback resistor R22, and the pulse P23 is supplied as a control signal to the switch circuit 41 in such a manner as to turn on the circuit 41 during a low level ("L") of the pulse P23 or to turn off the circuit 41 during a high level ("H") thereof.

According to this embodiment, therefore, the bias voltage V23 is supplied to the FET Q14 with the aforementioned operation performed during the time periods. However, during the subsequent period of the transmission signal S13, the resistor R22 is short-circuited by the switch circuit 41 and the voltage from the battery 31 is supplied directly to the FET Q14 without being lowered through the resistor R22, hence enhancing the efficiency of the source voltage.

Figure 4:
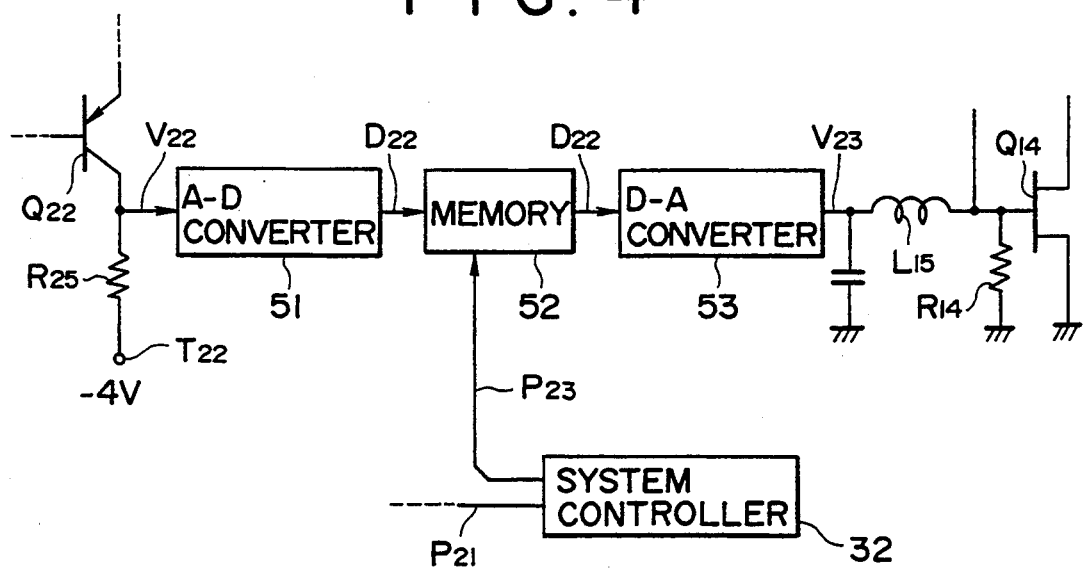
FIG. 4 is a circuit diagram partially showing a further embodiment of the invention.
Figure 8:
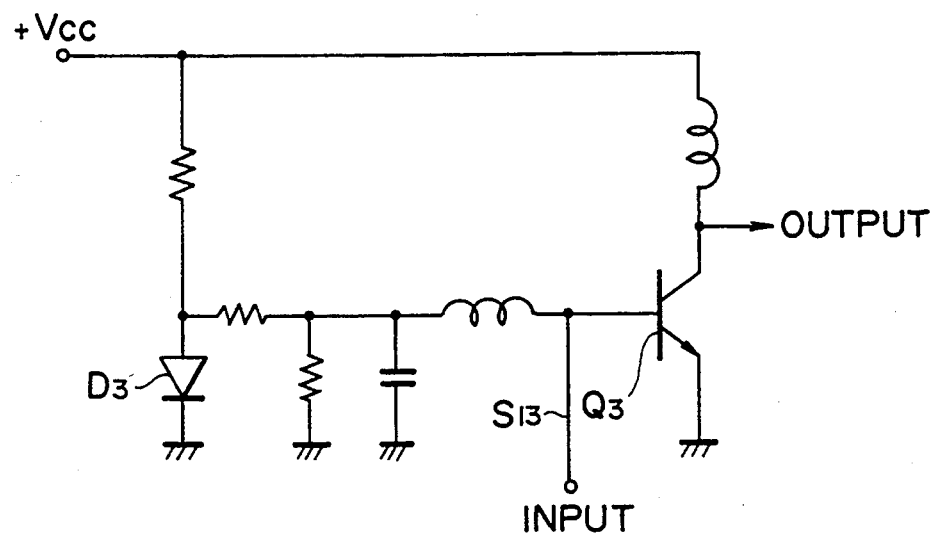
FIG. 8 is a circuit diagram of another conventional example.
Figure 9:
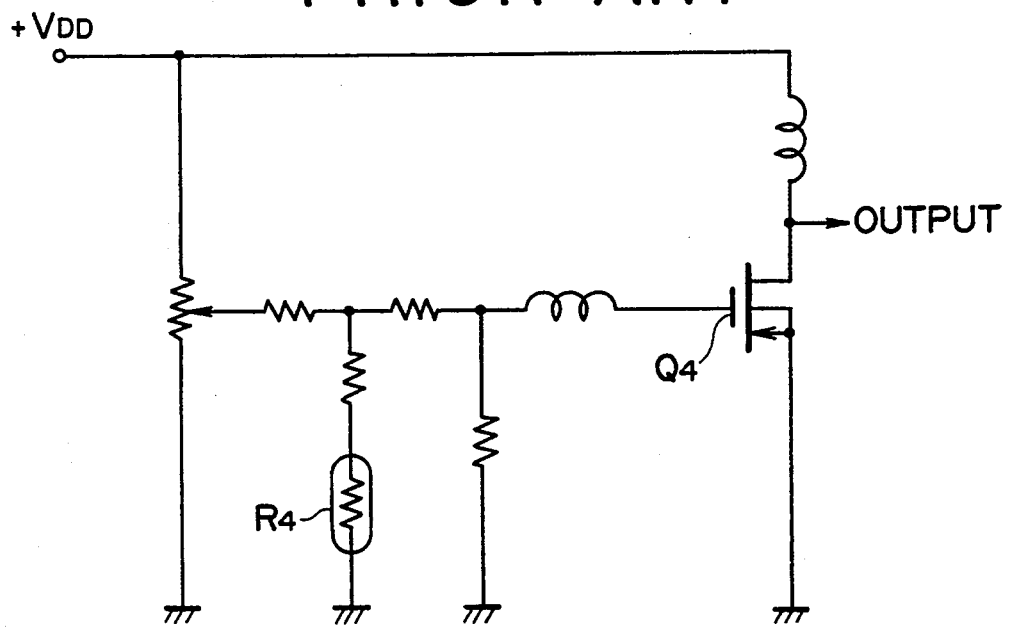
FIG. 9 is a circuit diagram of a further conventional example.

FIG. 4 shows a further embodiment of the present invention, where the equivalent or same component circuits and elements as those employed in the aforementioned embodiment of FIG. 1 are denoted by the same reference numerals, and a detailed description thereof is omitted. The embodiment of FIG. 4 represents an exemplary case of digitizing the sample and hold circuit 23 relative to the collector voltage V22. More specifically, the collector voltage V22 of the transistor Q22 is supplied to an A/D converter 51 to be thereby converted into digital data D22, which is then supplied to a latch memory 52. And the data D22 during the time period $\tau$ is latched in the memory 52 in response to the pulse P23 and is extracted therefrom repeatedly.

The data D22 thus extracted repeatedly is supplied to a D/A converter 53, which then produces a temporally continuous voltage, i.e., the sample-and-hold voltage V23, corresponding to the voltage V22 during the time period $\tau$. Subsequently this voltage V23 is supplied as a bias voltage to the gate of the FET Q14.

In any of the above embodiments, the final stage of the power amplifier 14 consists of a single-connection FET Q14. However, push-pull connection may also be employed, and a bipolar transistor may be used as well.

According to the present invention, as mentioned hereinabove, the idle current of the power amplifying FET is set to a predetermined value by controlling the gate bias voltage of the FET during the time period in which substantially none of the transmission signal is supposed to be supplied to the FET, and the gate bias voltage during such time period is sampled and held. Then the sampled voltage thus held is supplied as a gate bias voltage to the FET during the subsequent supply period of the transmission signal. Therefore the idle current of the FET can be retained at the set value despite occurrence of any temperature fluctuation in a wide range.

Since the idle current of the power amplifying FET can be maintained stably at the set value regardless of any temperature fluctuation, the efficiency of the power amplifier can be retained to be constant. And due to the advantage that the temperature compensation is updated every transmission of the intermittent signal, the idle current of the FET is maintained at the set value against any sharp temperature fluctuation. Furthermore, the idle current of the FET is kept free from the adverse influence derived from temperature fluctuation, so that the transmitting circuit may be installed in an automobile trunk or the like where great temperature fluctuation is prone to occur. Besides the above, there is no need to adjust the guaranty amount of temperature compensation relative to the FET, hence ensuring remarkable enhancement of the productivity.

What is claimed is:

1. A bias control circuit for a radio-frequency power amplifier which performs linear power amplification of a radio-frequency signal supplied thereto intermittently at a predetermined repetition cycle, said bias control circuit comprising:
    a bias voltage setting circuit for supplying a variable bias voltage to a power amplifying element during a time period in which substantially none of the radio-frequency signal is supposed to be supplied to said power amplifying element in order to set the idle current of said power amplifying element to a predetermined value;
    a circuit for feeding back the output current in said power amplifying element to control said bias voltage setting circuit;
    a sample and hold circuit for sampling and holding the bias voltage during the time period in which substantially none of the radio-frequency signal is supposed to be supplied to said power amplifying element; and
    means for disconnecting the bias voltage setting circuit from the power amplifying element and supplying the output voltage of said sample and hold circuit as a constant bias voltage to said power amplifying element during a subsequent time period in which said radio-frequency signal is supplied to said power amplifying element.

2. The bias control circuit according to claim 1, wherein said sample and hold circuit comprises:
    an A/D converter for executing analog-to-digital conversion of an input voltage;
    a memory for holding the output data of said A/D converter; and
    a D/A converter for executing digital-to-analog conversion of the data held in said memory.

3. A bias control circuit for a radio-frequency power amplifier which performs linear power amplification of a radio-frequency signal supplied thereto intermittently at a predetermined repetition cycle, said bias control circuit comprising:
    a bias voltage setting circuit for supplying a bias voltage of a predetermined value to a power amplifying element during a time period in which substantially none of the radio-frequency signal is supposed to be supplied to said power amplifying element, and setting the idle current of said power amplifying element to a predetermined value;
    a sample and hold circuit for sampling and holding the bias voltage during the time period in which substantially none of the radio-frequency signal is supposed to be supplied to said power amplifying element;
    wherein said bias voltage setting circuit incudes:
    a temperature compensating diode;
    a transistor supplied with the bias voltage including the terminal voltage of said diode; and
    a circuit for feeding back the output current in said power amplifying element to said transistor;
    wherein the output voltage of said transistor is supplied to said sample and hold circuit; and
    wherein the output voltage of said sample and hold circuit is supplied as a bias voltage to said power amplifying element during a subsequent time period in which said radio-frequency signal is supplied to said power amplifying element.

4. The bias control circuit according to claim 3, wherein a voltage from a power source is supplied to said power amplifying element during the time period of supply of said radio-frequency signal regardless of said feedback circuit.

5. The bias control circuit according to claim 3, wherein said sample and hold circuit comprises:
    an A/D converter for executing analog-to-digital conversion of an input voltage;
    a memory for holding the output data of said A/D converter; and
    a D/A converter for executing digital-to-analog conversion of the data held in said memory.

* * * * *